(12) United States Patent
Ahne et al.

(10) Patent No.: US 7,154,794 B2
(45) Date of Patent: Dec. 26, 2006

(54) MEMORY REGULATOR SYSTEM WITH TEST MODE

(75) Inventors: Adam J. Ahne, Lexington, KY (US); John G. Edelen, Versailles, KY (US)

(73) Assignee: Lexmark International, Inc., Lexington, KY (US)

( * ) Notice: Subject to any disclaimer, the term of this patent is extended or adjusted under 35 U.S.C. 154(b) by 183 days.

(21) Appl. No.: 10/961,464

(22) Filed: Oct. 8, 2004

(65) Prior Publication Data

US 2006/0077735 A1   Apr. 13, 2006

(51) Int. Cl.
 *G11C 29/00* (2006.01)
(52) U.S. Cl. ............. 365/201; 365/189.09; 365/185.18
(58) Field of Classification Search ................ 365/201, 365/189.09, 185.18
See application file for complete search history.

(56) References Cited

U.S. PATENT DOCUMENTS

| | | | |
|---|---|---|---|
| 4,683,382 A | 7/1987 | Sakurai et al. | |
| 5,253,201 A | 10/1993 | Atsumi et al. | |
| 5,309,399 A | 5/1994 | Murotani | |
| 5,382,843 A | 1/1995 | Gucyski | |
| 5,388,077 A | 2/1995 | Sanada | |
| 5,471,169 A | 11/1995 | Dendinger | |
| 5,576,990 A | 11/1996 | Camerlenghi et al. | |
| 5,751,635 A | 5/1998 | Wong et al. | |
| 5,757,226 A | 5/1998 | Yamada et al. | |
| 5,818,783 A | 10/1998 | Kim | |
| 5,831,302 A | 11/1998 | McIntyre | |
| 5,835,420 A | 11/1998 | Lee et al. | |
| 5,929,696 A | 7/1999 | Lim et al. | |
| 6,272,055 B1 | 8/2001 | Hidaka et al. | |
| 6,278,639 B1 | 8/2001 | Hosono et al. | |
| 6,327,198 B1 | 12/2001 | Kato et al. | |
| 6,392,944 B1 | 5/2002 | Kono | |
| 6,424,585 B1 | 7/2002 | Ooishi | |
| 6,487,120 B1 | 11/2002 | Tanzawa et al. | |
| 6,493,282 B1 | 12/2002 | Iida et al. | |
| 6,496,439 B1 | 12/2002 | McClure | |
| 6,498,469 B1 | 12/2002 | Kobayashi | |
| 6,535,424 B1 | 3/2003 | Le et al. | |
| 6,583,607 B1 | 6/2003 | Marty et al. | |
| 6,605,986 B1 | 8/2003 | Tanzawa et al. | |
| 6,614,706 B1 | 9/2003 | Feurle | |
| 6,628,554 B1 | 9/2003 | Hidaka | |
| 6,650,565 B1 | 11/2003 | Ohsawa | |
| 6,661,728 B1 | 12/2003 | Tomita et al. | |
| 6,724,671 B1 * | 4/2004 | Yumoto | 365/201 |
| 6,788,132 B1 | 9/2004 | Lim et al. | |
| 6,795,365 B1 | 9/2004 | Raad | |
| 2002/0030537 A1 | 3/2002 | Kobayashi et al. | |
| 2002/0030538 A1 | 3/2002 | Morishita | |
| 2002/0053943 A1 | 5/2002 | Yamasaki et al. | |
| 2002/0054532 A1 | 5/2002 | Ooishi et al. | |
| 2002/0171472 A1 | 11/2002 | Lim et al. | |

(Continued)

*Primary Examiner*—Huan Hoang
(74) *Attorney, Agent, or Firm*—Thompson Hine LLP

(57) ABSTRACT

A system for switching between a read mode and a write mode. The system includes a voltage regulating circuit and a memory array. The voltage regulating circuit includes a voltage input and a control input, wherein the control input regulates the voltage input between at least a first voltage output and a second voltage output. The voltage regulating circuit is in electrical communication with the memory array and supplies the memory array with the first voltage output to correspond to the read mode and the second voltage output to correspond to the write mode.

19 Claims, 3 Drawing Sheets

U.S. PATENT DOCUMENTS

| | | |
|---|---|---|
| 2003/0006832 A1 | 1/2003 | Ikehashi et al. |
| 2003/0016565 A1 | 1/2003 | Jang et al. |
| 2003/0151967 A1 | 8/2003 | Nagai et al. |
| 2004/0179417 A1 | 9/2004 | Lehmann et al. |
| 2004/0183587 A1 | 9/2004 | Yamahira |

* cited by examiner

MEMORY REGULATOR SYSTEM WITH TEST MODE

BACKGROUND

The present invention is directed to a memory regulator system and, more particularly, to a memory regulator system having a test mode.

Modern print heads often include a memory device (i.e., a memory array) located directly on the print head. Such print head memory arrays are designed to store various bits of information that assist in providing an efficient and user-friendly printer operation. For example, the print head memory array may store information such as the type of ink/toner cartridge, type of printer, amount of ink/toner used, diagnostic data and the like.

One such print head memory array is a floating gate memory array utilizing CMOS EPROM technology. The floating gate memory array may include a two-dimensional array of memory elements or cells, wherein each cell may be programmed to store data.

The memory array may operate as follows. Initially, each cell is in its native (i.e., unprogrammed) state and therefore corresponds to a digital "0." The cell is programmed by converting the digital "0" into a digital "1" when a sufficient voltage (e.g., 10 volts) is applied to the cell. Thus, data may be stored to the memory array by selectively programming cells in the array (i.e., the "write" mode). During a "read" mode, data may be retrieved from the memory array by applying a second voltage to the cell (e.g., 2.5 volts). The second voltage is not sufficient to write (or program the cell), but is sufficient to generate a current within the cell. The amount of current generated is measured and indicates whether or not the cell has been programmed (i.e., whether the cell is a "1" or a "0"). A small current (e.g., 5 milliamps) may correspond to the cell not being programmed and a large current (e.g., 100 milliamps) may correspond to the cell being programmed.

The printer may toggle between the write mode and the read mode by applying various voltages (e.g., 2.5 volts versus 10 volts) to the cells in the array. Accordingly, there is a need for a memory regulator system capable of supplying at least one voltage that corresponds to a read mode and a second voltage that corresponds to a write mode. Furthermore, there is a need for a memory regulator system having a test mode.

SUMMARY

A first embodiment of the present invention is a memory regulator system for switching between a read mode and a write mode. The system includes a voltage regulating circuit and a memory array. The voltage regulating circuit includes a voltage input and a control input, wherein the control input regulates the voltage input between at least a first voltage output and a second voltage output. The voltage regulating circuit is in electrical communication with the memory array and supplies the memory array with the first voltage output to correspond to the read mode and the second voltage output to correspond to the write mode.

In an alternative embodiment, the present invention is an electric circuit having a voltage regulating mode and a test mode, wherein the electric circuit is connected to a load circuit. The electric circuit includes a voltage input, a ground, a control input that regulates the voltage input between at least a first voltage output and a second voltage output when the electric circuit is in the voltage regulating mode, and at least one test input in electrical communication with at least one transistor, wherein the at least one test input supplies a first transistor voltage to the transistor when the electric circuit is in the voltage regulating mode and a second transistor voltage to the transistor when the electric circuit is in the test mode such that the transistor substantially prevents a current flow from the load circuit to the ground when the electric circuit is in the test mode.

BRIEF DESCRIPTION OF THE DRAWINGS

The invention can be understood with reference to the following drawings, in which like reference numerals designate corresponding parts throughout the several views.

DETAILED DESCRIPTION

Figure 1:
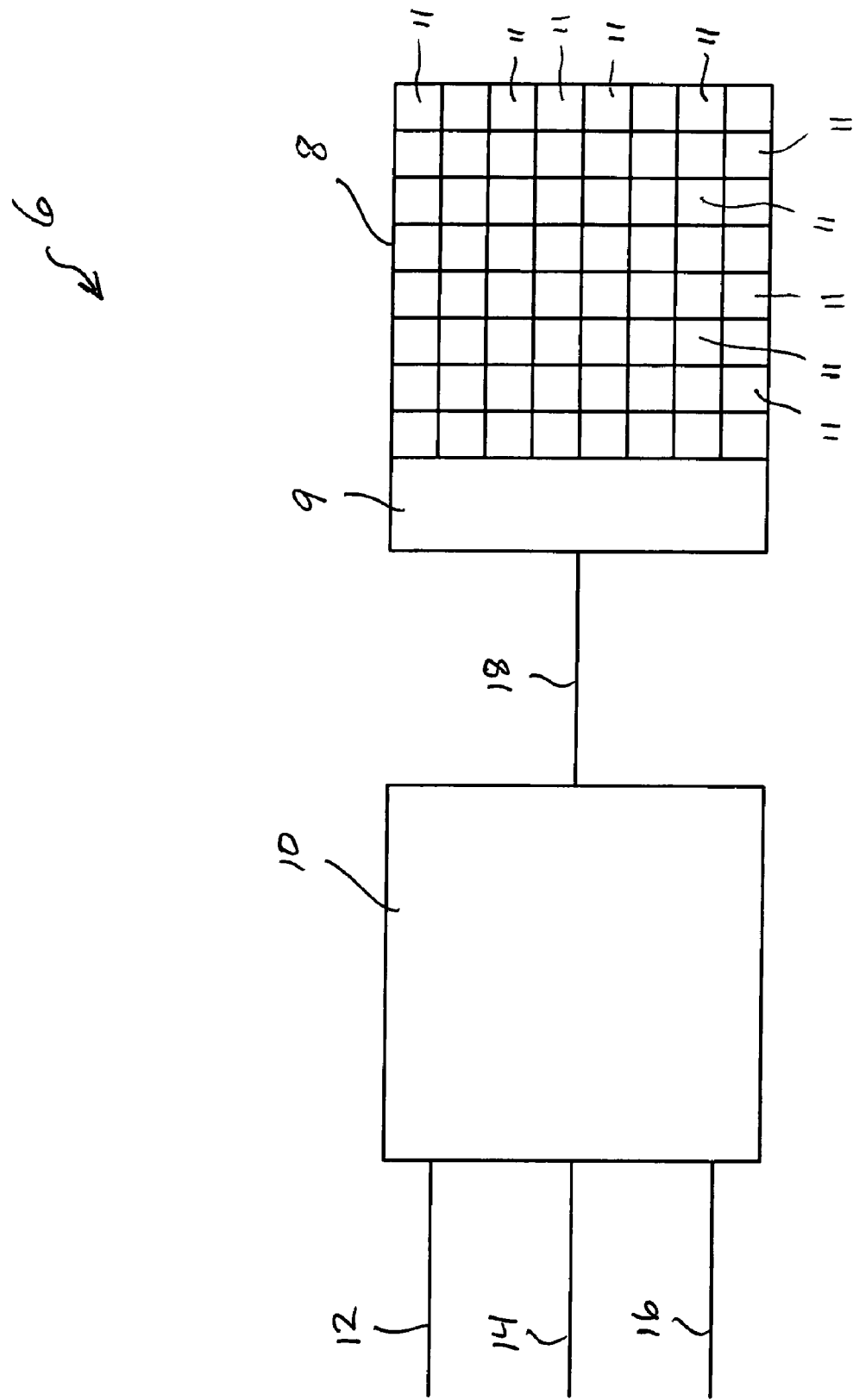
FIG. 1 is a block diagram of one embodiment of a memory regulator system according to one embodiment of the present invention.
Figure 2:
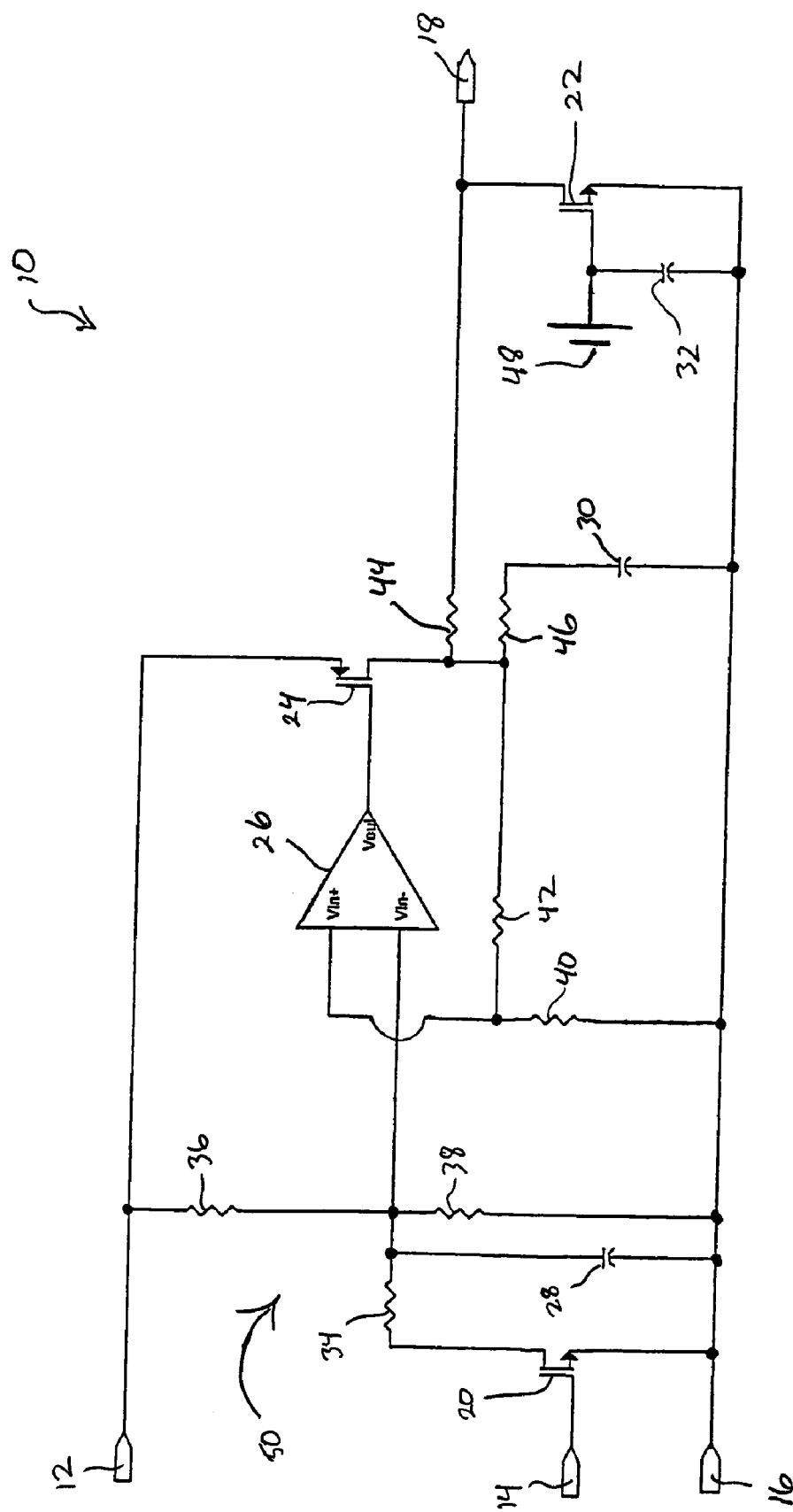
FIG. 2 is a schematic diagram of a voltage regulating circuit of the system of FIG. 1.

As shown in FIG. 1, the memory regulator system 6 includes a memory array 8, a voltage power rail 9 and a voltage regulating circuit 10. The memory array 8 may be a floating gate memory array having a two-dimensional array of memory elements or cells 11. Various other memory arrays may be used, such as fuse memories and the like. The voltage regulator circuit 10 (discussed in greater detail below) includes a voltage source or input 12, a control input 14, a ground 16 and a voltage output 18. The voltage output 18 is in electrical communication with the voltage power rail 9 such that the voltage power rail 9 can distribute the output voltage from the voltage regulator circuit 10 throughout the memory array 8.

The voltage regulator circuit 10 includes transistors 20, 22, 24, an operational amplifier 26, capacitors 28, 30, 32, resistors 34, 36, 38, 40, 42, 44, 46 and a power source 48. The operational amplifier 26 includes inputs $V_{in+}$ and $V_{in-}$ and output $V_{out}$.

Voltage input 12 supplies a voltage from the printer (not shown) to the circuit 10. For example, the voltage input 12 may be 11 volts. The circuit 10 regulates the voltage input 12 according to the control input 14 such that the voltage output 18 corresponds to either the read mode voltage (e.g., 2.5 volts) or the write mode voltage (e.g., 10 volts).

The control input 14 may be high (e.g., 3.3 volts) or low (0 volts). The control input 14 is based on signals received from the printer such as logic decoded serial data. When the control input 14 is high, the transistor 20 is active (i.e., turned on) such that current may flow through the transistor 20. Thus, resistor 34 is active when the control input 14 is high. When the control input 14 is low, the transistor 20 is inactive (i.e., turned off) such that no current may flow through transistor 20. Thus, resistor 34 is inactive when the control input 14 is low.

Resistors 34, 36, 38 form a resistance divider network 50 that regulates the voltage applied to the $V_{in-}$ input of operational amplifier 26. Accordingly, the voltage applied to the $V_{in-}$ input depends on whether resistor 34 is active (i.e., whether control input 14 is activating or deactivating transistor 20).

When transistor 20 is active, the voltage applied to the $V_{in-}$ input is as follows:

$$V_{in-} = V_{12} \frac{\left(\frac{R_{34}R_{38}}{R_{34}+R_{38}}\right)}{R_{36}+\left(\frac{R_{34}R_{38}}{R_{34}+R_{38}}\right)}$$

where $V_{12}$ is the voltage input 12, $R_{34}$ is the resistance of resistor 34, $R_{36}$ is the resistance of resistor 36 and $R_{38}$ is the resistance of resistor 38.

When transistor 20 is inactive, the voltage applied to the $V_{in-}$ input is as follows:

$$V_{in-} = V_{12}\left(\frac{R_{38}}{R_{36}+R_{38}}\right)$$

where $V_{12}$ is the voltage input 12, $R_{36}$ is the resistance of resistor 36 and $R_{38}$ is the resistance of resistor 38.

Accordingly, the resistances of resistors 34, 36, 38 can be selected to obtain a first desired voltage at the $V_{in-}$ input when resistor 34 is active (i.e., transistor 20 is active) and a second desired voltage at the $V_{in-}$ input when resistor 34 is inactive (i.e., transistor 20 is inactive). For example, when the input voltage 18 is 11 volts, resistors 34, 36, 38 can be selected such that a voltage of 5 volts is applied at the $V_{in-}$ input when resistor 34 is active and a voltage of 1.25 volts is applied at the $V_{in-}$ input when resistor 34 is inactive. It should be apparent to one skilled in the art that various voltage inputs and resistors may be used in combination with transistor 34 to switch between two different output voltages.

The operational amplifier 26 and resistors 40, 42 (collectively known as a non-inverting amplifier) amplify the voltage applied to the $V_{in-}$ input to provide the final voltage output 18. Assuming the resistance of resistor 44 is zero, the voltage output 18 may be calculated as follows:

$$V_{18} = V_{in-}\left(1 + \frac{R_{42}}{R_{40}}\right)$$

where $V_{18}$ is the voltage output 18, $R_{40}$ is the resistance of resistor 40 and $R_{42}$ is the resistance of resistor 42. For example, when the resistance of resistors 40 and 42 is equal (i.e., $R_{40}=R_{42}$), the operational amplifier 26 would have a gain of two.

Accordingly, expanding on the example above, when a voltage of 1.25 volts is applied to the $V_{in-}$ input and $R_{40}=R_{42}$, the voltage output 18 would be 2.5 volts (corresponding to the read mode) and when a voltage of 5 volts is applied to the $V_{in-}$ input and $R_{40}=R_{42}$, the voltage output 18 would be 10 volts (corresponding to the write mode).

Capacitor, resistors 44, 46 and transistor 22 may be provided on the circuit 10 to enhance the stability of the circuit 10.

Figure 3:
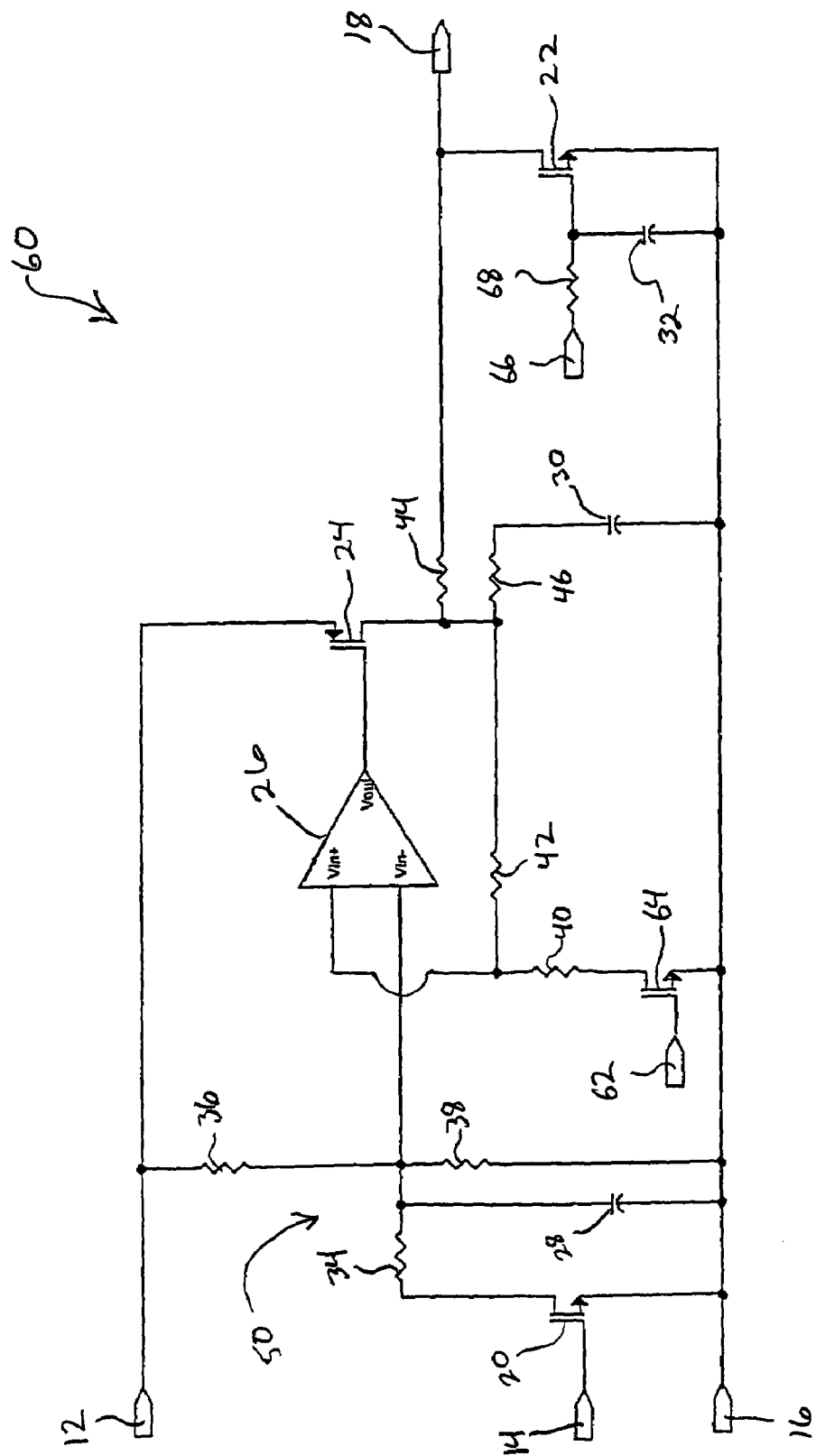
FIG. 3 is a schematic diagram of the voltage regulating circuit of FIG. 1 having a test mode.

As shown in FIG. 3, an alternative embodiment of the voltage regulating circuit, generally designated 60, additionally includes test inputs 62, 66, a transistor 64, capacitor 32 and a resistor 68. Transistor 64 is provided between resistor 40 and the ground 16 and is controlled by test input 62. Test input 66 is connected to transistor 22 (with resistor 68 positioned therebetween) for controlling transistor 22.

Test inputs 62, 66 ordinarily (i.e., during the voltage regulating mode, discussed above) supply a high voltage (e.g., 3.3 volts) to the corresponding transistors 64, 22 such that the transistors 64, 22 are ordinarily open and active (i.e., allow current and voltage to flow). However, when the test mode is initiated and a signal is sent to the test inputs 62, 66, the test inputs 62, 66 decrease the voltage supplied to the transistors 64, 22 (e.g., zero volts are supplied) such that the transistors 64, 22 deactivate and electrically isolate the output 18 from the ground 16. Capacitor 30 also isolates the output 18 from the ground 16 once the capacitor 30 is fully charged.

During the test mode, a voltage may be applied to output 18 for testing a load circuit (e.g., the memory array 8) connected to the voltage output 18. The testing of the load circuit cannot be conducted accurately if current is permitted to leak from the load circuit, through the voltage regulating circuit 10 and to the ground 16. Thus, the test mode electrically isolates the load circuit from the ground 16.

Although the invention is shown and described with respect to certain embodiments, it is obvious that equivalents and modifications will occur to those skilled in the art upon reading and understanding the specification. The present invention includes all such equivalents and modifications and is limited only by the scope of the claims.

What is claimed is:

1. A memory regulator system for switching between a read mode and a write mode, said system comprising:
    a voltage regulating circuit having:
        a ground;
        a voltage input; and
        a control input, wherein said control input regulates said voltage input between at least a first voltage output and a second voltage output;
    a memory array in electrical communication with said voltage regulating circuit, wherein said voltage regulating circuit supplies said memory array with said first voltage output corresponding to said read mode and said second voltage output corresponding to said write mode; and
    at least one transistor disposed between said memory array and said ground, wherein said transistor is adapted to electrically isolate said memory array from said ground during a test mode.

2. The system of claim 1 further comprising a voltage power rail positioned between said circuit and said memory array.

3. The system of claim 1 wherein said memory array is a floating gate memory array.

4. The system of claim 1 wherein said write mode programs a cell in said memory array with said second voltage output.

5. The system of claim 4 wherein said read mode determines whether a cell in said memory array has been programmed.

6. The system of claim 5 wherein said determination is based on measurements of current generated at said cell in response to application of said first voltage to said cell.

7. The system of claim 1 wherein said voltage regulating circuit includes an operational amplifier for amplifying said first and second voltage outputs.

8. The system of claim 1 wherein said first voltage output is about 1 volt to about 4 volts.

9. The system of claim 8 wherein said first voltage is about 2.5 volts.

10. The system of claim 1 wherein said second voltage is about 8 volts to about 12 volts.

11. The system of claim 10 wherein said second voltage is about 10 volts.

12. The system of claim 1 wherein said voltage regulating circuit and said memory array are positioned on a print head.

13. An electric circuit having a voltage regulating mode and a test mode, wherein said electric circuit is in electrical communication with a load circuit, said electric circuit comprising:
a voltage input;
a ground;
a control input, wherein said control input regulates said voltage input between at least a first voltage output and a second voltage output when said electric circuit is in said voltage regulating mode; and
at least one test input in electrical communication with at least one transistor, wherein said at least one test input supplies a first transistor voltage to said transistor when said electric circuit is in said voltage regulating mode and a second transistor voltage to said transistor when said electric circuit is in said test mode such that said transistor substantially prevents a current flow from said load circuit to said ground when said electric circuit is in said test mode.

14. The electric circuit of claim 13 wherein said load circuit is a memory array.

15. The electric circuit of claim 14 wherein said memory array is a floating gate memory array.

16. The electric circuit of claim 13 further comprising a operational amplifier for amplifying said first and second voltage outputs.

17. The electric circuit of claim 13 wherein said control input includes at least one input transistor.

18. The electric circuit of claim 17 further comprising a resistance divider network in electrical communication with said input transistor.

19. The electric circuit of claim 13 wherein said second transistor voltage is about zero volts.

* * * * *